United States Patent
Lin et al.

(10) Patent No.: US 7,235,838 B2
(45) Date of Patent: Jun. 26, 2007

(54) SEMICONDUCTOR DEVICE SUBSTRATE WITH EMBEDDED CAPACITOR

(75) Inventors: Chun-Chieh Lin, Hsinchu (TW); Wen-Chin Lee, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 169 days.

(21) Appl. No.: 10/881,372

(22) Filed: Jun. 30, 2004

(65) Prior Publication Data

US 2006/0003522 A1  Jan. 5, 2006

(51) Int. Cl.
*H01L 27/108* (2006.01)

(52) U.S. Cl. .................. 257/304; 257/E27.09
(58) Field of Classification Search ................ 257/304, 257/E27.09
See application file for complete search history.

(56) References Cited

U.S. PATENT DOCUMENTS

| | | | |
|---|---|---|---|
| 5,776,789 A | * | 7/1998 | Nakamura .................. 438/155 |
| 5,959,322 A | * | 9/1999 | Lee ............................. 257/298 |
| 2002/0117704 A1 | * | 8/2002 | Gonzalez ..................... 257/296 |
| 2002/0195639 A1 | * | 12/2002 | Deboer et al. .............. 257/301 |
| 2004/0082117 A1 | * | 4/2004 | Kastner et al. ............. 438/142 |
| 2004/0227172 A1 | * | 11/2004 | Park ............................ 257/295 |

* cited by examiner

*Primary Examiner*—B. William Baumeister
*Assistant Examiner*—Amar Movva
(74) *Attorney, Agent, or Firm*—Thomas, Kayden, Horstemeyer & Risley

(57) ABSTRACT

A method for forming a semiconductor device including a DRAM cell structure comprising a silicon on insulator (SOI) substrate with an embedded capacitor structure including providing a substrate comprising an overlying first electrically insulating layer; forming a first electrically conductive layer on the first electrically insulating layer to form a first electrode; forming a capacitor dielectric layer on the first electrode; forming a second electrically conductive layer on the capacitor dielectric layer to form a second electrode; forming a second electrically insulating layer on the second electrode; and, forming a monocrystalline silicon layer over the second electrode to form an SOI substrate comprising a first capacitor structure.

11 Claims, 5 Drawing Sheets

SEMICONDUCTOR DEVICE SUBSTRATE WITH EMBEDDED CAPACITOR

FIELD OF THE INVENTION

This invention generally relates to microelectronic integrated circuit (IC) semiconductor device fabrication and more particularly to DRAM devices including a substrate with an embedded capacitor.

BACKGROUND OF THE INVENTION

Dynamic random access memory (DRAM) is a staple aspect of the main memory of PC systems. DRAM may be used as an embedded portion of an integrated circuit or be formed as an array of memory cells. Fir example, in memory cell arrays an MOS transistor and a capacitor make up a memory unit (cell) whereby word-lines are used to switch a pass transistor between an on and of state to connect the bit line to the capacitor or to isolate the capacitor. The bit line is used for both the read and write operations to the storage node of the capacitor.

Generally, three types of DRAM memory cells are in use including planar capacitor DRAM cells, stack capacitor DRAM cells and trench capacitor DRAM cells. A key element of DRAM devices is the scaling down of feature sizes to produce a smaller memory cell and allow the formation of a higher density of memory cells.

One challenge for increasing DRAM density is maintain the same cell capacitance as memory cell sizes are scaled down. Generally three approaches are available for doing this including increasing the dielectric constant of the capacitor dielectric, reducing the thickness of the capacitor dielectric, and increasing the area of the capacitor dielectric.

Prior art processes general use silicon on insulator (SOI) technology requiring complex formation processes to form the capacitor architecture together with the MOS transistors and bit and word lines that make up an operating memory cell. As DRAM memory cell sizes decrease, the formation of trenches and electrode materials is increasingly difficult due to small etching process windows and the difficulty in handling advanced electrode and capacitor dielectric materials.

Another problem with prior art approaches to producing DRAM devices is the inefficient use of active device area space, for example, in the substrate underlying the MOS transistor source and channel regions, frequently increasing the DRAM cell area by forming capacitors adjacent the bit and word lines and/or taking part of the drain area.

There is therefore a continuing need in the semiconductor manufacturing art including the IC memory manufacturing art for improved DRAM cell architectures including capacitor architectures and method for forming the same to reliably increase a capacitor area while efficiently utilizing active area space.

It is therefore an object of the invention to provide improved DRAM cell architectures including capacitor architectures and method for forming the same to reliably increase a capacitor area while efficiently utilizing active area space, while overcoming other shortcomings and deficiencies of the prior art.

SUMMARY OF THE INVENTION

To achieve the foregoing and other objects, and in accordance with the purposes of the present invention, as embodied and broadly described herein, the present invention provides an embedded capacitor SOI substrate including a DRAM cell structure and method for forming the same.

In a first embodiment, the method includes providing a substrate comprising an overlying first electrically insulating layer; forming a first electrically conductive layer on the first electrically insulating layer to form a first electrode; forming a capacitor dielectric layer on the first electrode; forming a second electrically conductive layer on the capacitor dielectric layer to form a second electrode; forming a second electrically insulating layer on the second electrode; and, forming a monocrystalline silicon layer over the second electrode to form an SOI substrate comprising a first capacitor structure.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1A:
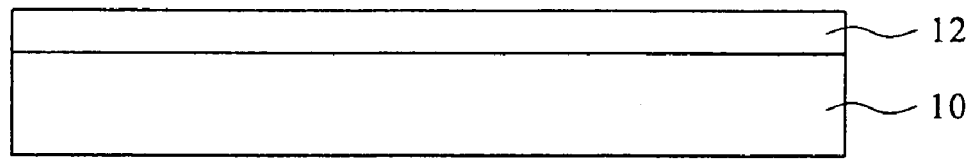
FIGS. 1A-1E are cross sectional views of a portion of a an embedded capacitor SOI substrate at manufacturing stages according to an embodiment of the present invention.

Referring to FIG. 1A, is shown a substrate 10, for example a semiconductor wafer such as silicon. An electrically insulating layer 12, for example an oxide such as silicon oxide is grown and/or deposited over the substrate 10 by conventional processes to a predetermined thickness.

Figure 1B:
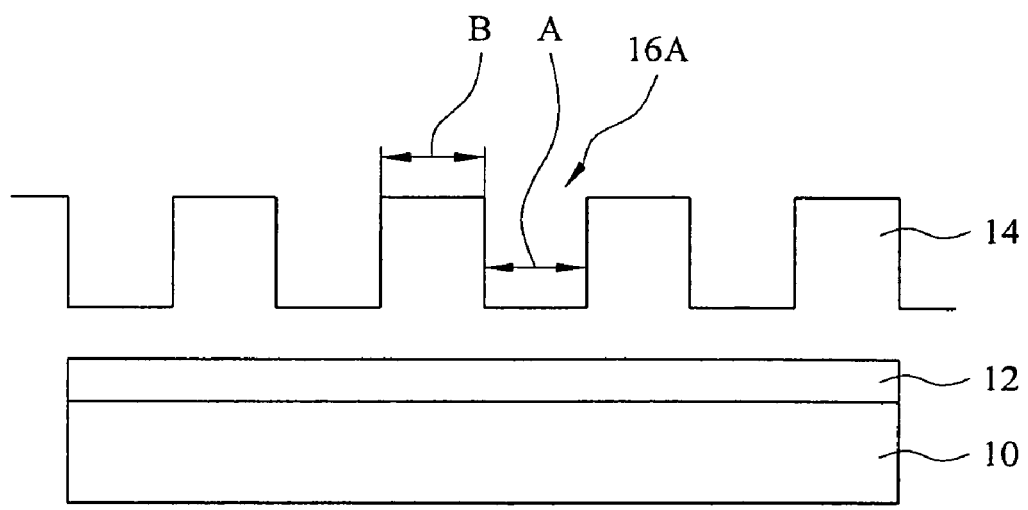

Referring to FIG. 1B, an electrically conductive material layer 14 is the formed over the electrically insulating layer 12 at a desired thickness to form a first capacitor electrode layer to a desired thickness. The first capacitor electrode layer may formed of any electrically conductive material including metals, metal oxides, metal nitrides, and metal oxynitrides as well as semiconductor materials such as doped or undoped polysilicon. The first capacitor electrode layer 14 is then patterned by conventional methods e.g., photoresist and/or a nitride hardmask, followed by a wet or dry etching process to form a series of spaced trench openings e.g., 16A through a thickness portion of the electrically conductive material layer 14. The first capacitor electrode layer 14 following trench formation may be etched to roughen or texture the surface of the first electrode to increase a contact surface area with a subsequently deposited capacitor dielectric, also referred to as hemispherical grain (HSG) surface. The trench opening widths e.g., A and spaces between trench openings e.g., B may have different or about the same widths with respect to one another, including having various groups of respective A and B widths at different portions of the process wafer.

Figure 1C:
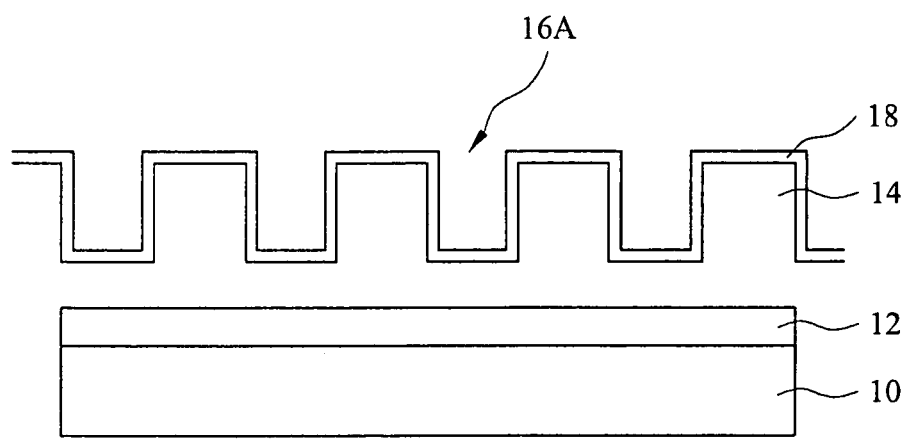

Referring to FIG. 1C, following forming of the trench openings e.g., 16A and removing resist and/or hardmask, a capacitor dielectric layer 18 is formed on the first capacitor electrode layer 14 by a conventional deposition process. The capacitor dielectric layer may be formed any high-K dielectric, preferably greater than about 10, more preferably greater than about 20, including oxides, nitrides, high-K dielectric materials, or combinations thereof. For example, the high-K materials may include tantalum pentaoxide ($Ta_2O_3$), barium strontium titanate (BST), strontium titanate ($SrTiO_3$), lead zirconate titanate (PZT), or combinations thereof. The capacitor dielectric layer 18 is formed at a desired thickness to form a desired capacitance depending on the material and subsequent application of the capacitor, e.g., a DRAM structure.

Figure 1D:
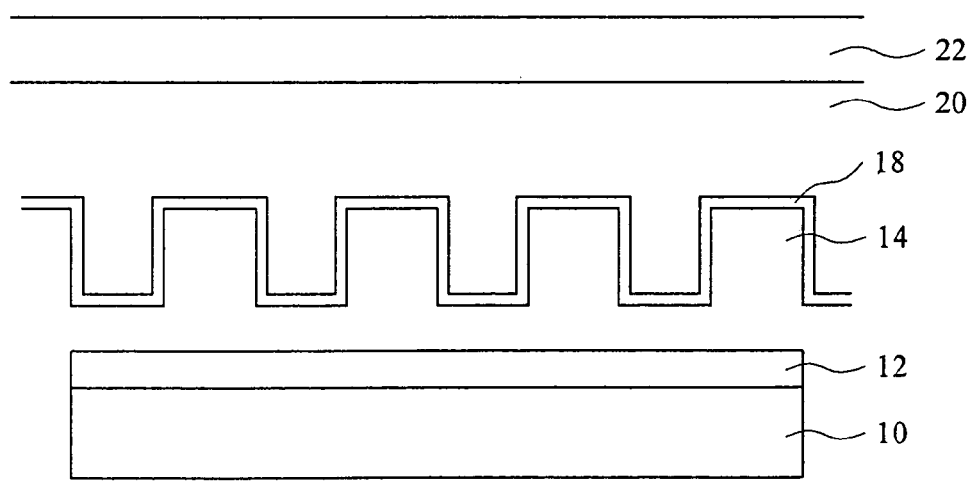

Referring to FIG. 1D, following formation of the capacitor dielectric layer 18, a second capacitor electrode (e.g., bottom electrode) layer 20 is formed on the capacitor dielectric layer and may be formed of the same or different material as the first capacitor electrode (e.g., top electrode) layer 14. Preferably, at least the second capacitor electrode includes a hemispherical grain (HSG) surface, for example formed by selective deposition of the second capacitor electrode layer 20, e.g., polysilicon, in contact with the capacitor dielectric layer 18. The second capacitor electrode layer 20 is then planarized, e.g., by a CMP process. An electrically insulating layer 22 is then formed on the second capacitor electrode layer 20. For example, the insulating layer 22 is an oxide layer formed by at least one of a thermal growth, chemical oxidation, plasma oxidation, and/or CVD oxide deposition process.

Figure 1E:
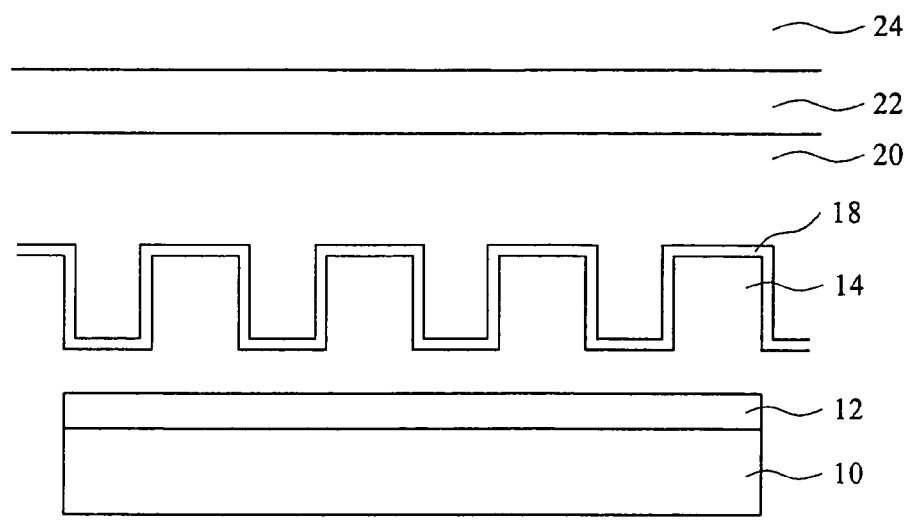

Referring to FIG. 1E, a monocrystalline silicon layer 24 is then formed over the electrically insulating layer 22. For example, preferably, a second silicon wafer major surface either bare or having an oxide layer (not shown) is bonded to the electrically insulating layer 22. The second silicon wafer is then processed to form a relatively thin layer of monocrystalline silicon as an uppermost layer 24 sufficiently thick to form FET transistors thereon. For example, the second silicon wafer may be implanted with an ion such as hydrogen followed by room temperature bonding to the electrically insulating layer 22 followed by an annealing process at 400° C. to 600° C. to cleave the second silicon wafer at an the implant depth leaving a thin portion of the second silicon wafer as an uppermost monocrystalline silicon layer 24 thereby forming a silicon on insulator (SOI) substrate. The monocrystalline silicon layer 24 is then planarized by CMP to complete the formation of the SOI substrate including an embedded capacitor structure.

Figure 2A:
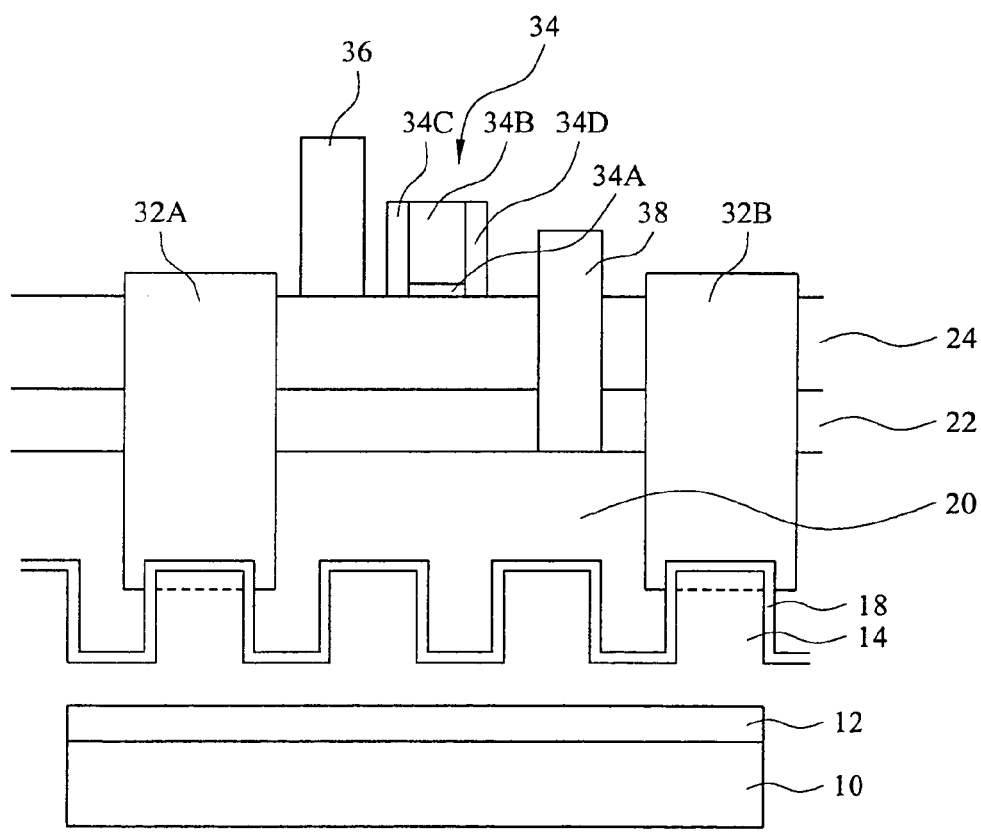
FIG. 2A is a cross sectional view of a DRAM memory cell structure according to an embodiment of the present invention using an embedded capacitor SOI substrate.

Referring to FIG. 2A is shown a DRAM cell according to an embodiment of the present invention produced using the SOI substrate with the embedded capacitor structure. For example conventional processes are carried out to form shallow trench isolation (STI) structures 32A and 32B to electrically isolate the DRAM cell, followed by forming a conventional FET structure 34, e.g., a word line, including a gate dielectric 34A, a gate electrode 34B, spacers 34C and 34D as well as doped source and drain regions (not shown) formed in the silicon layer 24 adjacent the spacers. Electrically conductive interconnects e.g., a bit line 36 are formed e.g., by a damascene process including forming a dielectric insulating layer (not shown) over the FET structure followed by forming interconnect openings and backfilling with a conductive material to form a bit line 36 overlying a drain region.

Conventional processes such as salicide formation over source and drain regions may be included in the FET formation process. In addition, an electrically conductive capacitor electrode contact e.g., 38 is formed by etching a contact opening through the silicon layer 24 and through the second electrically insulating layer 22 to contact the second capacitor electrode (e.g., bottom electrode) 20 on the source region side of the FET structure followed by backfilling with a conductive material.

Advantageously, according to the present invention, conventional processes to form the FET structure and interconnect lines of the DRAM memory cell may be easily implemented in a second separate process flow using previously formed SOI substrates with the embedded capacitor structure, thereby avoiding process integration difficulties of forming the capacitor and the FET structures in a single process flow. In addition, the embedded capacitor structure efficiently uses space below the DRAM cell active area thereby allowing ready formation of scaled down Dram cell sizes.

Figure 2B:
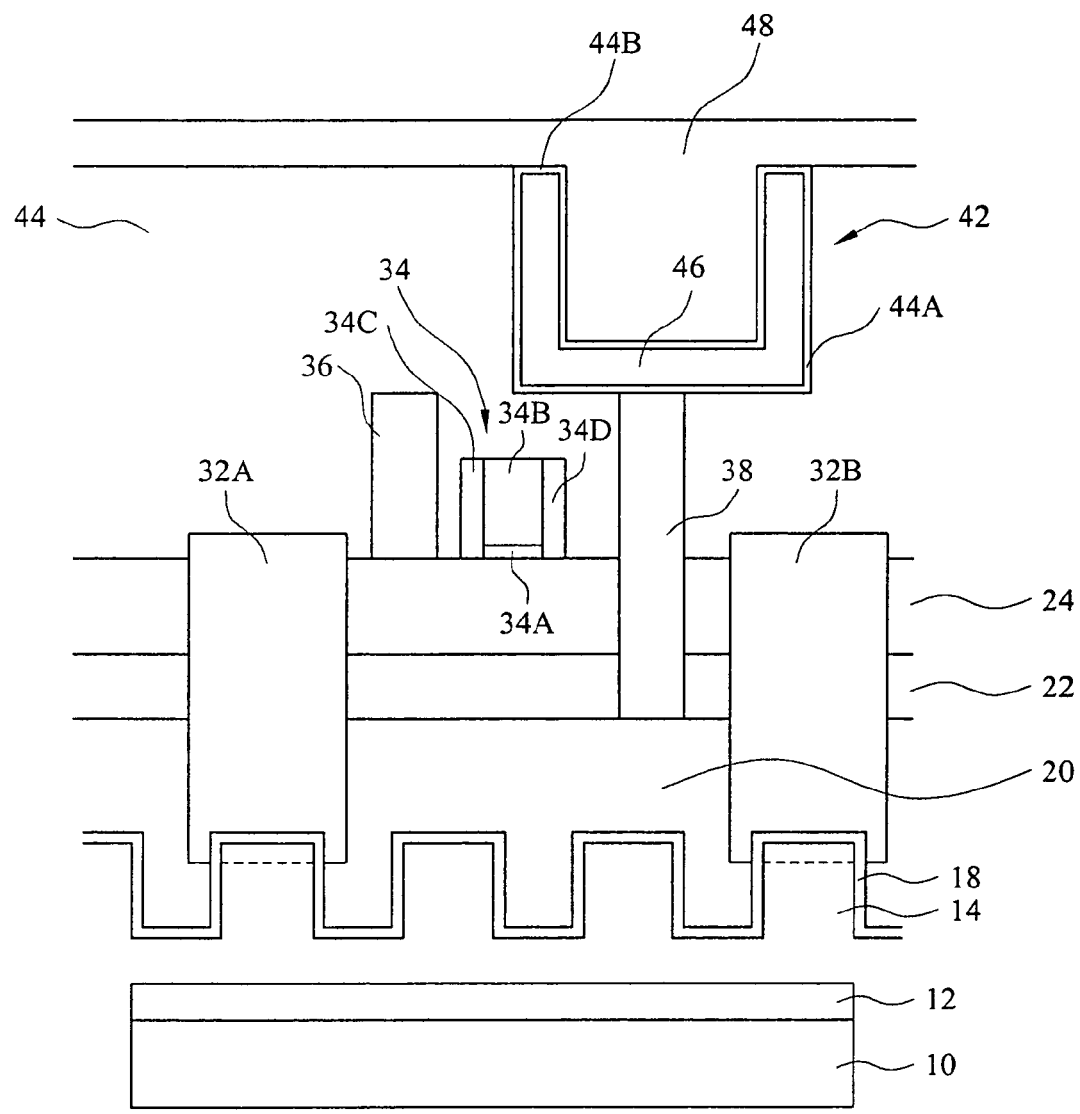
FIG. 2B is a cross sectional view of a DRAM memory cell structure according to an embodiment of the present invention using an embedded capacitor SOI substrate.

Referring to FIG. 2B, is shown a second DRAM cell according to an embodiment of the present invention produced using the SOI substrate with the embedded capacitor structure. In this embodiment, a second capacitor structure, preferably a stacked or trench capacitor structure is formed in electrical contact, preferably wired in parallel, with the embedded capacitor structure to form a stacked capacitor structure. For example, a trench 42 is formed in insulating layer 40, followed by forming a first capacitor dielectric layer 44A along the trench bottom and sidewalls. A first conductive material layer 46 is then formed on the capacitor dielectric material layer 44A to form a bottom capacitor electrode followed by forming a second capacitor dielectric material layer 44B on the bottom capacitor electrode 46, followed by forming a second conductive material layer 48 on the second capacitor dielectric material layer 44B to form a top electrode.

Thus, an SOI substrate with an embedded capacitor structure has been presented including a method for forming the same. DRAM cell structures have been presented using the embedded capacitor SOI substrate. Advantageously, according to the present invention the embedded trench capacitor SOI substrate increases an available capacitance by at least about twice compared to prior art processes, advantageously maximizing capacitor surface area while efficiently using the substrate space under active areas for bit line, word line, and electrical contact formation. The embedded trench capacitor SOI substrate may advantageously be formed in a separate process flow thereby overcoming process integration issues in forming capacitors and DRAM cell structures in a single process flow. In addition, the quality of the performance of the embedded capacitor structure may be separately tested and verified prior to the bit line, word line, and electrical contact formation process flow, thereby improving DRAM cell yield, throughput, and device reliability. Moreover, a variety of DRAM cell structures including single and stacked capacitor structures with improved substrate area utilization may then be easily formed in a second process flow over the embedded trench capacitor SOI substrate thereby offering ready scalability.

Figure 3:
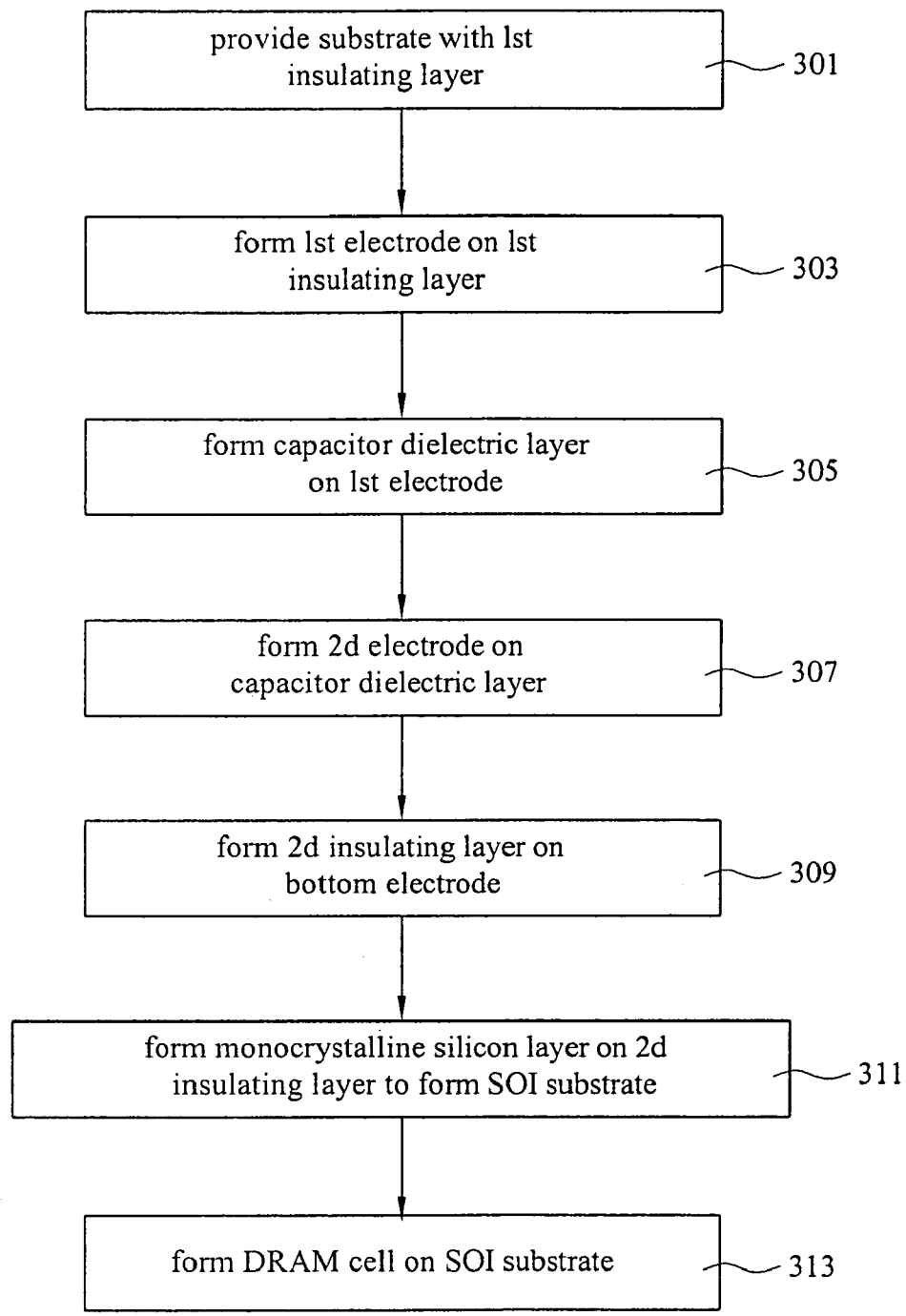
FIG. 3 is a process flow diagram including several embodiments of the present invention.

Referring to FIG. 3 is a process flow diagram including several embodiments of the present invention. In process 301, a substrate, e.g., wafer with an overlying first electrically insulating layer is provided. In process 303, a top capacitor electrode is formed on the first electrically insulating layer according to preferred embodiments. In process 305, a capacitor dielectric material layer is formed on the top capacitor electrode. In process 307, a bottom capacitor electrode is formed on the capacitor dielectric material layer. In process 309, a second electrically insulating layer is formed on the bottom electrode. In process 311 a monocrystalline silicon layer is formed on the second electrical insulating layer to form an SOI substrate with an embedded capacitor. In process 313 a DRAM cell including a bit line, a word line and a bottom electrode contact is formed over the SOI substrate.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A semiconductor device comprising: a first semiconductor silicon wafer as a substrate; a first electrically insulating layer overlying the substrate; a first capacitor structure comprising a first electrode with trenches formed through a thickness thereof, overlying the first electrically insulating layer; a second electrically insulating layer overlying the first capacitor structure; a second semiconductor silicon wafer, which has undergone a thinning process, as a monocrystalline silicon layer bonded to the second electrically insulating layer; a word line comprising a gate electrode overlying the monocrystalline silicon layer; and a second capacitor structure neighboring the word line, overlying the monocrystalline silicon layer; wherein the second capacitor structure is entirely above the monocrystalline silicon layer and is in electrical communication to the first capacitor structure underlying the monocrystalline silicon layer by a single contact plug passing through the monocrystalline silicon layer.

2. The semiconductor device of claim 1, further comprising:
   a memory cell; and
   shallow isolation structures, passing through the second electrically insulating layer and the monocrystalline silicon layer to the trenches of the first electrode for isolation of the memory cell.

3. The semiconductor device of claim 1, further comprising:
   a bit line, overlying the monocrystalline silicon layer; and
   a third electrically insulating layer, overlying the bit line, the word line and the monocrystalline silicon layer;
   wherein the second capacitor structure is entirely disposed in the third electrically insulating layer above the word line.

4. The semiconductor device of claim 1, wherein the first capacitor structure further comprises:
   a capacitor dielectric layer on the first electrode; and
   a second electrode on the capacitor dielectric layer.

5. The semiconductor device of claim 1, wherein the second capacitor structure comprises a stacked or trench capacitor structure.

6. The semiconductor device of claim 2, wherein the memory cell is a DRAM cell comprising the first capacitor structure and the second capacitor structure in parallel therewith.

7. The semiconductor device of claim 3, wherein the single contact plug passes through the third electrically insulating layer on the monocrystalline silicon layer, the second electrically insulating layer under the monocrystalline silicon layer, and the monocrystalline silicon layer for electrical connection of the first capacitor structure and the second capacitor structure.

8. The semiconductor device of claim 3, wherein the first electrically insulating layer, the second electrically insulating layer and the third electrically insulating layer comprise silicon oxide.

9. The semiconductor device of claim 4, wherein at least one of the first and second electrodes comprises a textured surface or a hemispherical grain surface (HSG) in contact with the capacitor dielectric layer.

10. The semiconductor device of claim 4, wherein the capacitor dielectric layer is selected from the group consisting of oxides, nitrides, tantalum pentaoxide (Ta2O3), barium strontium titanate (BST), strontium titanate (SrTiO3), lead zirconate titanate (PZT), and combinations thereof.

11. The semiconductor device of claim 4, wherein the first and second electrodes are formed of a material selected from the group consisting of metals, metal nitrides, metal oxides, semiconductors, and polysilicon.

* * * * *